United States Patent

Khandros et al.

[11] Patent Number: 5,258,330
[45] Date of Patent: Nov. 2, 1993

[54] SEMICONDUCTOR CHIP ASSEMBLIES WITH FAN-IN LEADS

[75] Inventors: Igor Y. Khandros, Peekskill; Thomas H. DiStefano, Bronxville, both of N.Y.

[73] Assignee: Tessera, Inc., Elmsford, N.Y.

[21] Appl. No.: 19,994

[22] Filed: Feb. 17, 1993

Related U.S. Application Data

[60] Continuation of Ser. No. 864,596, Apr. 7, 1992, abandoned, which is a division of Ser. No. 673,020, Mar. 21, 1991, Pat. No. 5,148,265, which is a continuation-in-part of Ser. No. 586,758, Sep. 24, 1990, Pat. No. 5,148,266.

[51] Int. Cl.⁵ ............................................. H01L 21/60
[52] U.S. Cl. ................................... 437/209; 437/211; 437/215; 437/217
[58] Field of Search ............... 437/209, 211, 215, 217; 357/70, 74, 80

[56] References Cited

U.S. PATENT DOCUMENTS

| | | |
|---|---|---|
| 3,302,067 | 1/1967 | Jackson et al. |
| 3,390,308 | 3/1966 | Marley |
| 3,426,252 | 2/1969 | Lepselter ............... 357/74 |
| 3,474,297 | 10/1969 | Bylander |
| 3,487,541 | 1/1970 | Boswell |
| 3,614,832 | 10/1971 | Chance et al. ............... 357/74 |
| 3,680,037 | 7/1972 | Nellis |
| 3,680,206 | 8/1972 | Roberts ............... 357/80 |
| 3,683,105 | 8/1972 | Shamash et al. |
| 3,772,575 | 11/1973 | Hegarty et al. ............... 357/80 |
| 3,795,037 | 3/1974 | Luttmer |
| 3,832,769 | 9/1974 | Olyphant, Jr. et al. |
| 3,862,790 | 1/1975 | Davies et al. |
| 3,864,728 | 2/1975 | Peltz et al. |
| 3,868,724 | 2/1975 | Perrino ............... 357/80 |
| 4,179,802 | 12/1979 | Joshi |
| 4,237,607 | 12/1980 | Ohno |

(List continued on next page.)

FOREIGN PATENT DOCUMENTS

WO89/12911 12/1989 PCT Int'l Appl.

1003396 3/1983 U.S.S.R.

OTHER PUBLICATIONS

Microelectronics Packaging Handbook, Rao R. Tummala and Eugen J. Rymaszewski 1989, pp. 420–423 and 1132.

Primary Examiner—Brian E. Hearn
Assistant Examiner—Kevin M. Picardat
Attorney, Agent, or Firm—Lerner, David, Littenberg, Krumholz & Mentlik

[57] ABSTRACT

A semiconductor chip having contacts on the periphery of its top surface is provided with an interposer overlying the central portion of the top surface. Peripheral contact leads extend inwardly from the peripheral contacts to central terminals on the interposer. The terminals on the interposer may be connected to a substrate using techniques commonly employed in surface mounting of electrical devices, such as solder bonding. The leads, and preferably the interposer, are flexible so that the terminals are movable with respect to the contacts on the chip, to compensate for differential thermal expansion of the chip and substrate. The terminals on the interposer may be disposed in an area array having terminals disposed at substantially equal spacings throughout the area of the interposer, thus providing substantial distances between the terminals while accommodating all of the terminals in an area approximately the same size as the area of the chip itself. The interposer may be provided with a compliant layer disposed between the terminals and the chip to permit slight vertical movement of the terminals towards the chip during testing operations. The chip and interposer assembly may be electrically tested prior to assembly to the substrate. A compliant layer disposed between the terminals and the chip permits slight vertical movement of the terminals towards the chip during testing operations, in which the terminals on the interposer are engaged with an assembly of test probes. The entire assembly is compact.

16 Claims, 13 Drawing Sheets

U.S. PATENT DOCUMENTS

| | | |
|---|---|---|
| 4,356,374 | 10/1982 | Noyori et al. ............... 219/121 |
| 4,410,905 | 10/1983 | Grabbe . |
| 4,545,610 | 10/1985 | Lakritz et al. . |
| 4,574,470 | 3/1986 | Burt . |
| 4,604,644 | 8/1986 | Beckham et al. . |
| 4,627,151 | 12/1986 | Mullholland et al. . |
| 4,628,406 | 12/1986 | Smith et al. . |
| 4,670,770 | 6/1987 | Tai . |
| 4,681,654 | 7/1987 | Clementi et al. . |
| 4,685,998 | 8/1987 | Quinn et al. ............... 357/70 |
| 4,709,468 | 12/1987 | Wilson . |
| 4,710,798 | 12/1987 | Marcantonio . |
| 4,721,993 | 1/1988 | Walter . |
| 4,751,199 | 6/1988 | Phy . |
| 4,751,482 | 6/1988 | Fukuta et al. ............... 357/74 |
| 4,764,804 | 8/1988 | Sahara et al. ............... 437/209 |
| 4,793,814 | 12/1988 | Zifcak et al. . |
| 4,796,078 | 2/1989 | Phelps, Jr. et al. . |
| 4,811,082 | 3/1989 | Jacobs et al. ............... 357/74 |
| 4,814,295 | 3/1989 | Mehta . |
| 4,818,728 | 4/1989 | Rai et al. ............... 437/974 |
| 4,855,867 | 8/1989 | Gazdik . |
| 4,874,721 | 10/1989 | Kimura et al. . |
| 4,878,098 | 10/1989 | Saito et al. ............... 357/80 |
| 4,884,122 | 11/1989 | Eichelberger et al. ............... 357/80 |
| 4,893,172 | 1/1990 | Matsumoto et al. ............... 357/79 |
| 4,926,241 | 5/1990 | Carey ............... 357/75 |
| 4,937,203 | 6/1990 | Eichelberger et al. ............... 437/211 |
| 4,941,033 | 7/1990 | Kishida ............... 357/80 |
| 4,942,140 | 7/1990 | Ootsuki et al. ............... 437/209 |
| 4,967,261 | 10/1990 | Niki et al. ............... 357/70 |
| 4,989,069 | 1/1991 | Hawkins ............... 357/74 |
| 5,086,337 | 2/1992 | Noro et al. ............... 357/79 |

SEMICONDUCTOR CHIP ASSEMBLIES WITH FAN-IN LEADS

This is a continuation of application Ser. No. 07/864,596 filed on Apr. 7, 1992 now abandoned which is divisional of 07/673,020 filed on Mar. 21, 1991 now U.S. Pat. No. 5,148,265, which is a CIP of 07/586,758 filed on Sep. 24, 1990 now U.S. Pat. No. 5,148,266.

BACKGROUND OF INVENTION

The present invention relates to the art of electronic packaging, and more specifically to assemblies incorporating semiconductor chips and to methods of making such assemblies.

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. Moreover, the size of each assembly controls the required distance between each chip and other chips, or between each chip or other elements of the circuit. Delays in transmission of electrical signals between chips are directly related to these distances. These delays limit the speed of operation of the device. For example, in a computer where a central processing unit operates cyclically, signals must be interchanged between the central processing unit chip and other chips during each cycle. The transmission delays inherent in such interchanges often limit the cycling rate of the central processing chip. Thus, more compact interconnection assemblies, with smaller distances between chips and smaller signal transmission delays can permit faster operation of the central processing chip.

The first level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the chip and the substrate ordinarily are formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress. These stresses are applied repeatedly with repeated operation of the device, and can cause breakage of the electrical interconnections. Thermal cycling stresses may occur even where the chip and substrate are formed from like materials having similar coefficients of thermal expansion, because the temperature of the chip may increase more rapidly than the temperature of the substrate when power is first applied to the chip.

The cost of the chip and substrate assembly is also a major concern. All these concerns, taken together, present a formidable engineering challenge. Various attempts have been made heretofore to provide primary interconnection structures and methods to meet these concerns, but none of these is truly satisfactory in every respect. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern, The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate.

Wire bonding ordinarily can only be employed with contacts at the periphery of the chip. It is difficult or impossible to make connections with contacts at the center of the front surface of the chip using the wire bonding approach. Also, the contacts on the chip must be spaced at least about 100 micrometers apart from one another. These considerations limit the wire bonding approach to chips having relatively few I/O connections, typically less than about 250 connections per chip. Moreover, the area of the substrate occupied by the chip, the wires and the contact pads of the substrate is substantially greater than the surface area of the chip itself.

In tape automated bonding, a polymer tape is provided with thin layers of metallic material forming conductors on a first surface of the tape. These conductors are arranged generally in a ring-like pattern and extend generally radially, towards and away from the center of the ring-like pattern. The chip is placed on the tape in a face down arrangement, with contacts on the front surface of the chip confronting the conductors on the first surface of the tape. The contacts on the chip are bonded to the conductors on the tape. Ordinarily, numerous patterns of conductors are arranged along the length of the tape and one chip is bonded to each of these individual patterns, so that the chips, once bonded to the tape, can be advanced through successive work stations by advancing the tape. After each chip is bonded to the metallic conductors constituting one pattern, the chip and the immediately adjacent portions of the pattern are encapsulated and the outermost portions of the metallic conductors are secured to additional leads and to the ultimate substrate. Tape automated bonding can provide the assembly with good resistance to thermal stresses, because the thin metallic leads on the tape surface are quite flexible, and will bend readily upon expansion of the chip without imposing significant stresses at the juncture between the lead and the contact on the chip. However, because the leads utilized in tape automated bonding extend outwardly in a radial, "fan out" pattern from the chip, the assembly is much larger than the chip itself. Also, the leads ordinarily are connected only to contacts at the periphery of the chip. This limits tape automated bonding to chips having relatively low numbers of contacts.

In flip-chip bonding, contacts on the front surface of the chip are provided with bumps of solder. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquify the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it is difficult to test and operate or "burn-in" chips having an area array of contacts before attaching the chip to the substrate. Additionally, flip-chip bonding ordinarily requires that the contacts on the chip be arranged in an area array to provide adequate spacing for the solder bumps. Flip-chip bonding normally cannot be applied to chips originally designed for wire bonding or tape automated bonding, and having rows of closely spaced contacts on the periphery of the chip.

Our own prior U.S. patent application 07/586,758 discloses improvements in semiconductor chip assemblies and methods of making the same. As more fully set forth in the '758 application, a semiconductor chip can be connected to a substrate using a sheet-like, and preferably flexible, interposer. The interposer overlies the top, contact-bearing surface of the chip. A first surface of the interposer faces towards the chip whereas a second surface faces away from the chip. Electrical terminals are provided on the second surface of the interposer, and the interposer is also provided with apertures extending through it. Flexible leads extend through these apertures between contacts on the chip and the terminals on the second surface of the interposer. The terminals can be bonded to a substrate. Because the terminals are movable relative to the contacts on the chip, the arrangements described in the '758 application provide excellent resistance to thermal cycling. The interposer disclosed in the '758 application may include a soft, compliant layer disposed between the terminals and the chip. Because the terminals can be disposed in the area of the interposer overlying the contact pattern area of the chip, the structures described in the '758 application provide extraordinarily compact assemblies, substantially as compact as those achieved by flip-chip bonding. The invention described in the '758 application can be used with substantially any chip configuration, including so-called peripheral contact chips having contacts arranged in rows adjacent the periphery of the chip, as well as so-called area array chips having contacts disposed in an array substantially covering the entire face of the chip.

However, still further improvements would be desirable. In particular, there are needs for still further improvements in mountings to accommodate chips having peripheral contacts. Most conventional chips such as random access memories and the more common microprocessors are commonly manufactured with peripheral contact arrangements.

SUMMARY OF THE INVENTION

The present invention addresses these needs.

One aspect of the present invention provides semiconductor chip assemblies. A chip assembly according to this aspect of the present invention preferably incorporates a chip having a front or top surface including a central region and a peripheral region surrounding the central region, the chip having a plurality of peripheral contacts disposed in the peripheral region of the front surface. The assembly preferably further includes a sheet-like dielectric interposer overlying the central region of the chip front surface. The interposer has a first surface facing downwardly toward the chip and a second surface facing upwardly, away from the chip. The interposer also has edges disposed inwardly of the peripheral contacts. For example, the interposer may overly only the central portion of the chip front surface. A plurality of central terminals are disposed on the interposer and overly the central region of the chip front surface. The assembly preferably also includes a plurality of peripheral contact leads connecting at least some of the peripheral contacts on the chip with at least some of the central terminals on the interposer. Each such peripheral contact lead thus has a central terminal end overlying the interposer and connected to one of the central terminals and a contact end projecting outwardly beyond one of the edges of the interposer and connected to one of the peripheral contacts. Each peripheral contact lead extends inwardly from one of the peripheral contacts to one of the central terminals on the interposer. The peripheral contact leads and preferably the interposer as well are at least partially flexible so that the central terminals are movable with respect to peripheral contacts to accommodate movement caused by differential thermal expansion. Desirably, the peripheral contact leads include bent portions.

The peripheral contact leads and central terminals provide a "fan-in" arrangement in which the terminals on the interposer are disposed inside the region bounded by the peripheral contacts on the chip. Typically, the peripheral contacts on the chip are disposed in one or two rows along each edge of the chip, in a generally rectangular pattern, so that the contacts on the chip are close to one another. By contrast, the terminals on the interposer may be substantially evenly disposed over the second surface of the interposer. The central terminals may be disposed in a so-called "area array". Accordingly, the distance between adjacent terminals may be substantially greater than the distance between adjacent contacts on the chip. The distances between adjacent terminals on the interposer may be large enough to accommodate solder bonding and similar processes which require substantial distances between adjacent bonds. Such bonds may be accommodated in the previously unused area overlying the center of the chip. The peripheral contact leads may be connected to the peripheral contacts of the chip by a bonding method similar to those used with conventional "fan-out" leads, such as wire bonding or thermal compression bonding. The chip assembly may further include a substrate having electrically conductive contact pads, the chip and interposer being superposed on the substrate so that the second surface of the interposer faces toward the substrate and, preferably, so that the terminals on the interposer are aligned with the contact pads on the substrate. The interposer terminals and the substrate contact pads may be electrically connected and secured to one another, as by an electrically conductive material such as solder disposed therebetween. Assemblies according to preferred embodiments of this aspect of the invention provide both compactness and resistance to thermal stress.

Some or all of the peripheral contact leads may have outward extensions projecting outwardly beyond the peripheral contacts of the chip. The assembly may include securement means for holding these outward extensions. For example, one or more securement elements may be disposed outwardly of the peripheral contacts, and each such securement element may be physically connected to a plurality of the outward extensions on the peripheral contact leads. Each such securement element may be a generally planar strip of dielectric material having an inboard edge extending generally parallel to one of the edges of the interposer so that each pair of parallel edges define an elongated slot between each such securement element and the interposer, and each peripheral contact lead may extend across one of these slots. In this arrangement, the peripheral contacts of the chip may be disposed in alignment with the slots between the securement elements and the interposer. The securement element may be physically connected to the interposer, as by bridge elements extending between the securement elements and the interposer at spaced-apart locations around the periphery of the chip front surface. The securement elements, bridge elements and interposer may be formed integrally with one another as a single, sheet-like unit. The bridge elements may be disposed at the corners of a rectangular or other polygonal chip contact pattern. The securement elements provide physical reenforcement to the peripheral contact leads during the manufacturing operations and in service. Additional terminals, referred to herein as "outside" terminals, may be disposed on the securement elements, and may be connected to some of the peripheral contacts on the chip by outside terminal leads extending across the slots, the inboard ends of the outside terminal leads being secured to the interposer so that the slot and interposer cooperatively provide reinforcement to the outside terminal leads as well.

The interposer desirably includes a compliant layer of a material having a relatively low elastic modulus, such as an elastomeric material. This compliant layer is disposed beneath the central terminals, i.e., between the central terminals and the front surface of the chip. It permits slight downward movement of the central terminals towards the front face of the chip. As further explained below, this greatly facilitates temporary engagement of the central terminals by test equipment and hence facilitates testing and "burn-in" of the chip and interposer assembly before the same is mounted to a substrate. A further aspect of the present invention incorporates the realization that the compliance of such a compliant layer may be substantially enhanced by providing holes in the compliant layer, so that the compliant layer includes masses of compliant material interspersed with holes. Desirably, each such mass is aligned with one of the central terminals. This aspect of the present invention is not limited to assemblies incorporating the particular peripheral contact and central terminal arrangement mentioned above. It can be used in other arrangements incorporating a compliant layer disposed between terminals and a chip, such as the assemblies described in our U.S. patent application 07/586,758.

The semiconductor chip typically has a rear or bottom surface extending generally parallel to the front surface of the chip, and has edges extending between these front and rear surfaces at the outer periphery of the chip, outboard of the peripheral contacts. In a variant of the present means may include a backing element having a top surface overlying the rear surface of the chip, the backing element extending outwardly beyond at least some of the edges of the chip. At least some of the outboard extensions of the peripheral contact leads may extend beyond the edges of the chip and may be secured to the backing element. The backing element may support outside terminals outboard of the edges of the chip, and at least some of the outboard extensions of the peripheral contact leads may be connected to the outside terminals on the backing element. The backing element may have inside terminals disposed in a central region of the backing element aligned with the chip, and the central terminals may be electrically connected to the outside terminals of the backing element. In this arrangement, the chip is disposed between the backing element and the interposer, with the interposer on the front of the chip and the backing element on the back of the chip, both elements bearing terminals connected to the peripheral contacts of the chip.

A further aspect of the present invention provides a circuit assembly including a plurality of chip assemblies, each including an interposer and a backing element as discussed above. According to this aspect of the invention, the chip assemblies may be arranged in a stack, one on top of the other, such that each chip assembly other than the bottom-most chip assembly overlies another, immediately subjacent chip assembly. The bottom surface of the backing element in each such overlying chip assembly faces the second surface of the interposer of the immediate subjacent chip assembly. Most preferably, at least some of the inside terminals on the backing element of each such overlying chip assembly are connected to the central terminals on the interposer of the immediately subjacent chip assembly, so that the chips of the various chip assemblies are electrically connected to one another. Preferably, the inside terminals of the backing element of each chip assembly are aligned with the central terminals on the interposer of the immediately subjacent chip assembly. Preferably, the aligned inside and central terminals are connected to one another by masses of electrically conductive material such as solder disposed therebetween.

As discussed above, the chip assemblies, according to this aspect of the present invention, are particularly useful in the case of chips having peripheral contacts. The chip may also have a pattern of central contact disposed on the central region of the front surface. In this case, the interposer may have a hole aligned with the central contact pattern and inboard edges bounding the hole. The assembly may incorporate central contact leads extending from at least some of the central contacts on the chip to at least some of the central terminals on the interposer. In this case, the central contact leads extend outwardly in a "fan-out" pattern from the center of the chip towards the periphery of the chip, whereas the peripheral contact leads extend inwardly in a "fan-in" pattern from the periphery of the chip toward the center of the chip.

Further aspects of the present invention provide methods of making semiconductor assemblies. One method according to this aspect of the present invention includes the steps of providing a semiconductor chip having central and peripheral regions and peripheral contacts disposed in the peripheral region of the front surface. The method further includes the step of assembling a sheet-like dielectric interposer to the chip so that the interposer overlies the central region of the chip front surface, the outboard edges of the interposer being disposed inwardly of the peripheral contacts on the chip. When the dielectric interposer is disposed on the chip, a first surface of the interposer faces downwardly toward the chip and a second surface of the interposer faces upwardly away from the chip, and a plurality of central terminals on the interposer overly the central region of the chip front surface. The method further includes the step of connecting a plurality of peripheral contact leads between at least some of the peripheral contacts of the chip and at least some of the central terminals on the interposer, so that each such peripheral contact lead extends inwardly from one of the peripheral contacts on the chip to one of the central terminals on the interposer. The method may further include the step of assembling a substrate having a plurality of contact pads to be assembled interposer and chip and connecting each of the central terminals on the interposer to one of the contact pads on the substrate.

The interposer may have prefabricated leads mounted thereon and connected to the central terminals before the interposer is assembled to the chip. In this case, the prefabricated contact leads are positioned on the chip when the interposer is assembled to the chip. Such prefabricated contact leads may be electrically connected to the contacts of the chip by thermal compression bonding or similar processes. Alternatively, the peripheral contact leads may be formed after the interposer is applied to the chip, as in a wire-bonding step in which a fine wire is dispensed and formed into a lead connecting the contact and terminal. Preferably, securement elements are provided as discussed above with reference to the chip assembly, and the securement elements are connected to the interposer before the interposer is placed on the chip. In this case, the securement elements may support the prefabricated leads during the step of placing the interposer on the chip. The fabrication method according to this aspect of the present invention desirably further includes the step of connecting the terminals on the interposer to contact pads on a substrate. Also, the method according to this aspect of the present invention, desirably includes the step of applying an encapsulant to cover at least the peripheral contacts on the chip. Preferably, the encapsulant is applied so that it does not cover the central terminals on the interposer.

Assembly methods according to this aspect of the invention can provide simple and economical assembly of the chips to the substrates.

Still further aspects of the present invention provide prefabricated interposers having features as discussed above in connection with the assemblies and assembly methods. The interposers, with terminals and, preferably, prefabricated leads can be made and sold as separate articles of manufacture. These interposers can be employed in assembly methods and assemblies, as discussed above.

These and other objects, features and advantages of the present invention will be more readily apparent from the detailed description of the preferred embodiment set forth below, taken in conjunction with the accompanying drawings.

DETAILED DESCRIPTION OF THE PREFERRED EMBODIMENTS

Figure 1:
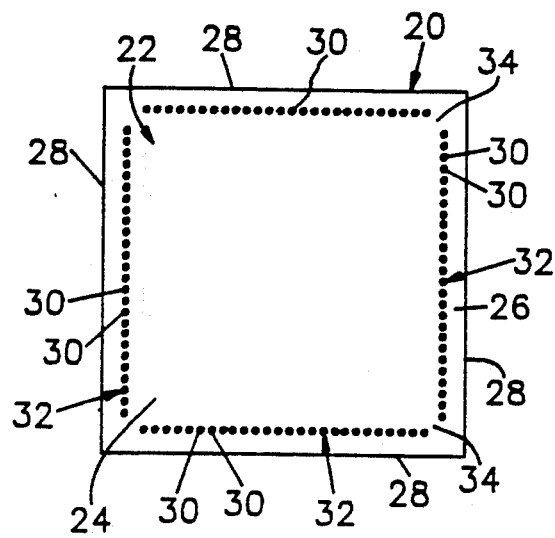
FIG. 1 is a diagrammatic plane view of a semiconductor chip incorporated in one embodiment of the present invention.

As shown in FIG. 1, a semiconductor chip 20 may have a generally planar front face 22 (the face visible in FIG. 1) having a central region 24 adjacent the geometric center of the face and a peripheral region 26 adjacent the edges 28 bounding face 22. The front or contact-bearing face 22 of the chip is regarded as defining the top of the chip. Thus, in specifying direction pointing out of front face 22, and away from the chip, i.e., the direction pointing out of the plane of the drawing towards the viewer in FIG. 1. The downward direction is the opposite direction. As used in the present disclosure with respect to a semiconductor chip assembly, such terms should be understood as based on this convention, and should not be understood as implying any particular directions with respect to the ordinary gravitational frame of reference. The chip also has a plurality of peripheral contacts 30 arranged in rows 32, there being one such row adjacent each edge 28 of the chip. The rows 32 do not intersect one another but instead terminate at appreciable distances from the corners of the chip so that the corners 34 are devoid of peripheral contacts 30. The central region 24 of the chip front surface 22 is also devoid of contacts. The contacts 30 in each row 32 are spaced at very close intervals typically about 100 to about 250 micrometers center to center. This center to center spacing is adequate for wire bonding or tape automated bonding. This chip configuration is typical of high I/O count chips originally intended for use with wire bonding or tape automated bonding systems.

In an assembly method according to one embodiment of the invention, a sheet-like dielectric interposer 36 is assembled to chip 20. Interposer 36 includes a flexible top layer 38 (FIG. 3) formed by a thin sheet of material having a relatively high elastic modulus and a compliant bottom layer 40 formed from a material having a relatively low elastic modulus. The high-modulus material of top layer 38 may be a polymer such as a polyimide or other thermoset polymer, a fluoropolymer or a thermoplastic polymer. The compliant, low-modulus material of bottom layer 40 may be an elastomer. Desirably, the low-modulus material has elastic properties (including modulus of elasticity) comparable to those of soft rubber, about 20 to 70 Shore A durometer hardness. Interposer 36 has a first or bottom surface 42 defined by bottom layer 40 and a second or top surface 44 defined by top layer 38. Bottom, compliant layer 40 includes holes or voids 41 interspersed with masses 43 of the low-modulus material.

Interposer 36 has edges 46 bounding surfaces 42 and 44 and extending therebetween. The interposer also has a plurality of central terminals 48 distributed over the second or top surface 44. Terminals 48 are disposed at substantially even spaces on surface 44 so that terminals 48 constitute a "area array". The dimensions of interposer 36 in the plane of top surface 44 are smaller than the corresponding dimensions of chip 20 in the plane of front surface 22. The number of central terminals 48 may be approximately equal to the number of peripheral contacts 30 on the semiconductor chip Nonetheless, the center-to-center linear distance between adjacent ones of central terminals 48 is substantially greater than the center-to-center distance between adjacent peripheral contacts 30 on the chip, because the central contacts 48 are substantially evenly distributed rather than concentrated in only a few rows. Each central terminal 48 is aligned with one of the masses 43 of low-modulus material in complaint layer 40, whereas the holes 41 in the complaint layer are out of alignment with the central terminals 48. In a variation of this embodiment, the holes may be aligned with terminals 48. In a further variation, the holes may be continuous with one another whereas the masses of low-modulus material may be separate posts or pillars entirely surrounded by such continuous holes.

Figure 2:
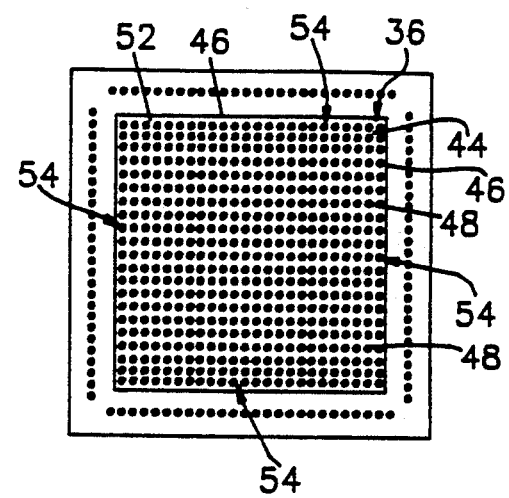
FIG. 2 is a view similar to FIG. 1 but showing the chip in conjunction with additional components.
Figure 3:
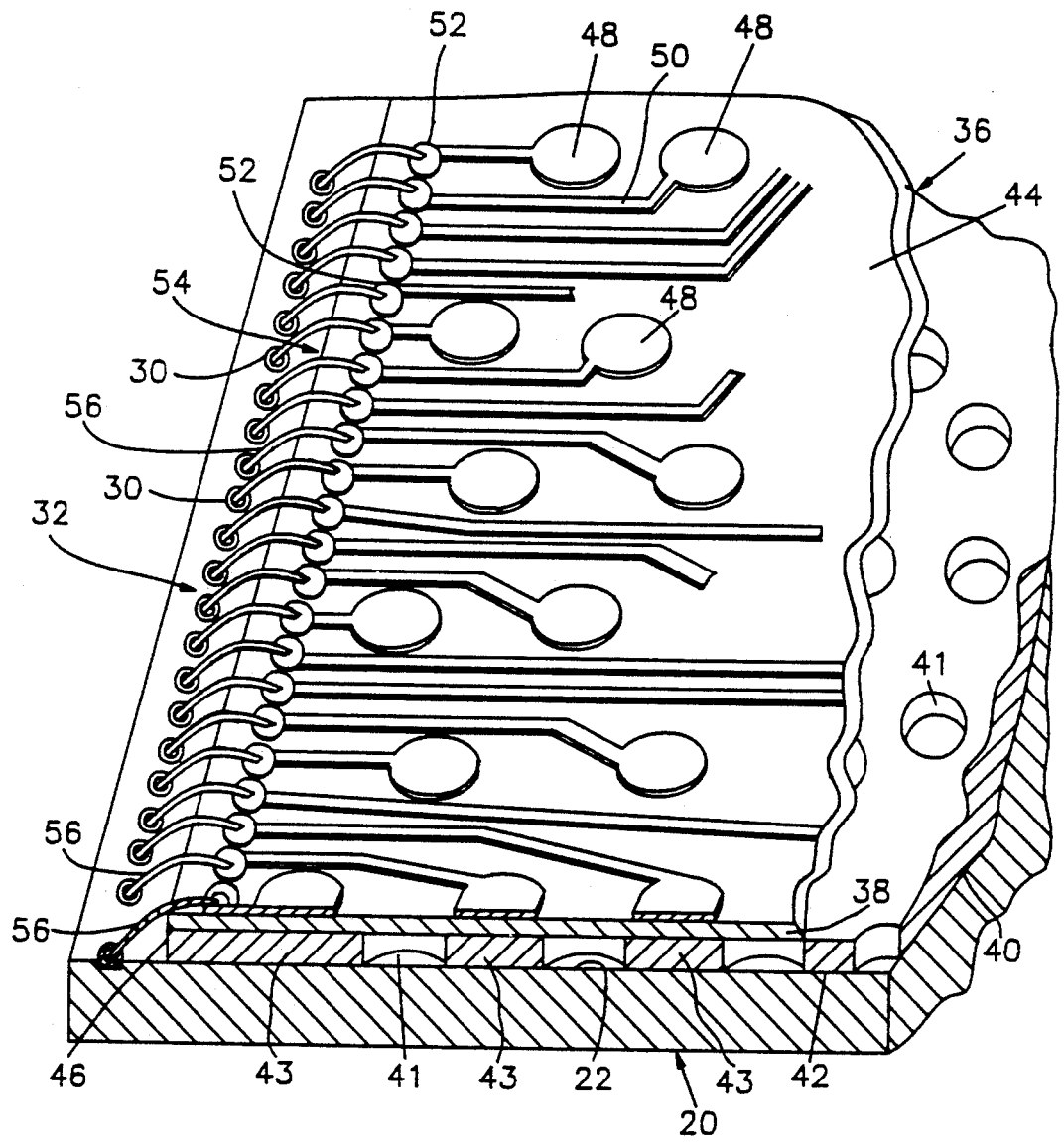
FIG. 3 is a fragmentary, partially sectional perspective view on an enlarged scale depicting portions of the components illustrated in FIG. 2.

As best seen in FIG. 3, each central terminal 48 is connected with a partial lead 50 and a bonding terminal 52 which are formed integrally with the central terminal. Central terminals 48, partial leads 50 and bonding terminals 52 may be formed from substantially any electrically conductive material, but preferably are formed from metallic material such as copper and copper alloys, noble metals and noble metal alloys. These components typically are fabricated on the top or second surface 44 of interposer 36 by conventional photolithographic end etching or deposition techniques. Bonding terminals 52 are arranged in rows 54 adjacent the edges 46 of the interposer. As best seen in FIG. 2, there are four such rows 54 of bonding terminals, one adjacent each edge of the interposer.

In the assembly method according to this embodiment of the invention, the interposer 36 with the preformed terminals 48, partial leads 50 and bonding terminals 52 thereon is positioned on chip 20 so that the first surface 42 of the interposer faces the front surface 22 of the chip, and so that the edges 46 of the interposer are disposed inwardly of the rows 32 of peripheral contacts 30 on the chip. Bonding terminals 52 are electrically connected to contacts 30 on the chip by a conventional wire bonding operation. The arrangement of the bonding terminals 52 in rows parallel to and adjacent to the rows of peripheral contacts 30 on the chip substantially facilitates the wire bonding process. The fine, flexible bonding wires 56 applied in the wire bonding operation merge with the bonding terminals 52 and partial leads 50 on the interposer to form composite leads extending from the peripheral contacts of the chip to the central terminals on the interposer. As best appreciated with reference to FIG. 3, each such composite lead extends inwardly from one peripheral contact 30 to an associated central terminal 48 in the central way. Each such composite lead extends across the edge 46 of the interposer.

Figure 4:
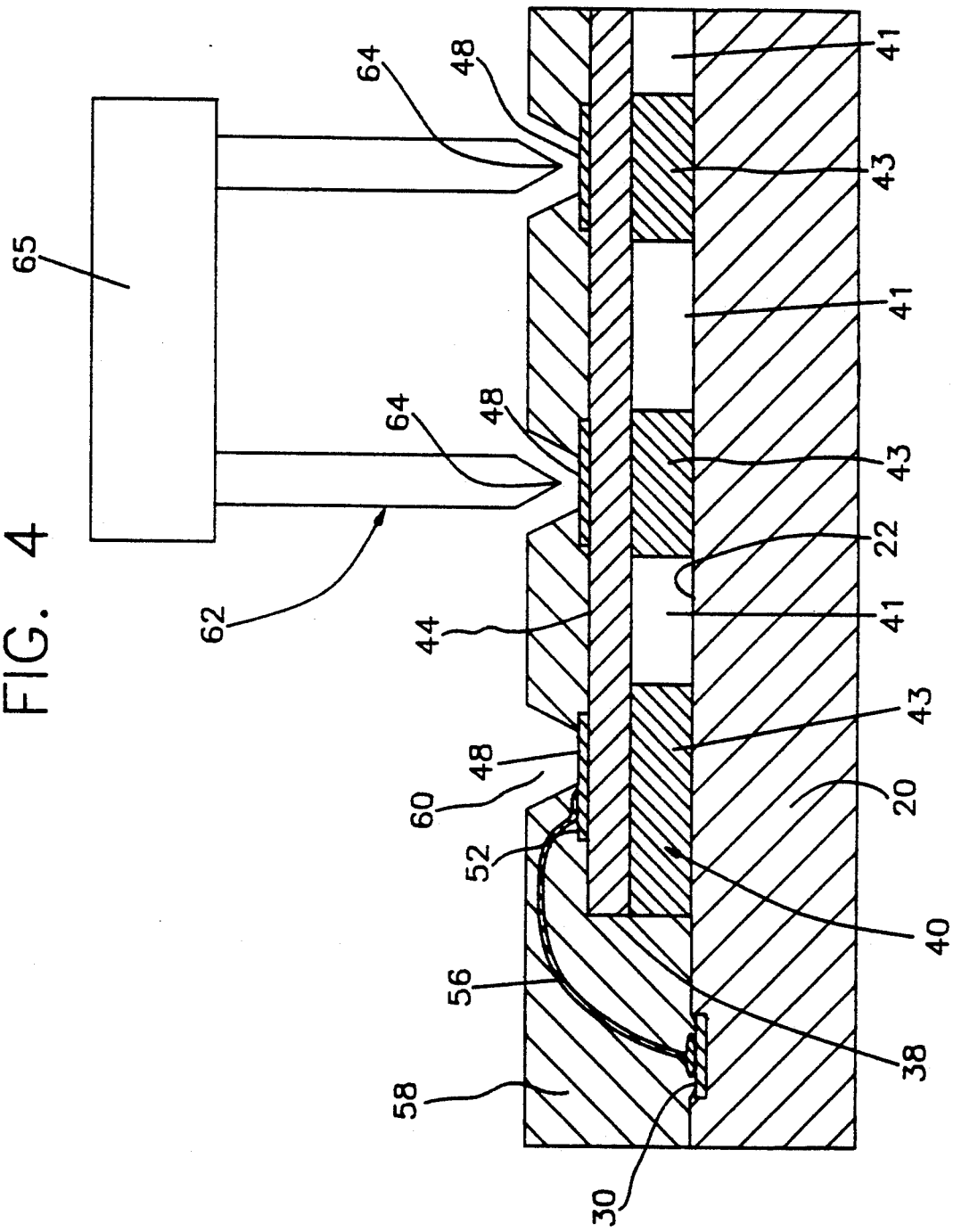
FIG. 4 is a fragmentary, diagrammatic sectional view depicting the components shown in FIG. 3 together with additional components and process equipment.
Figure 5:
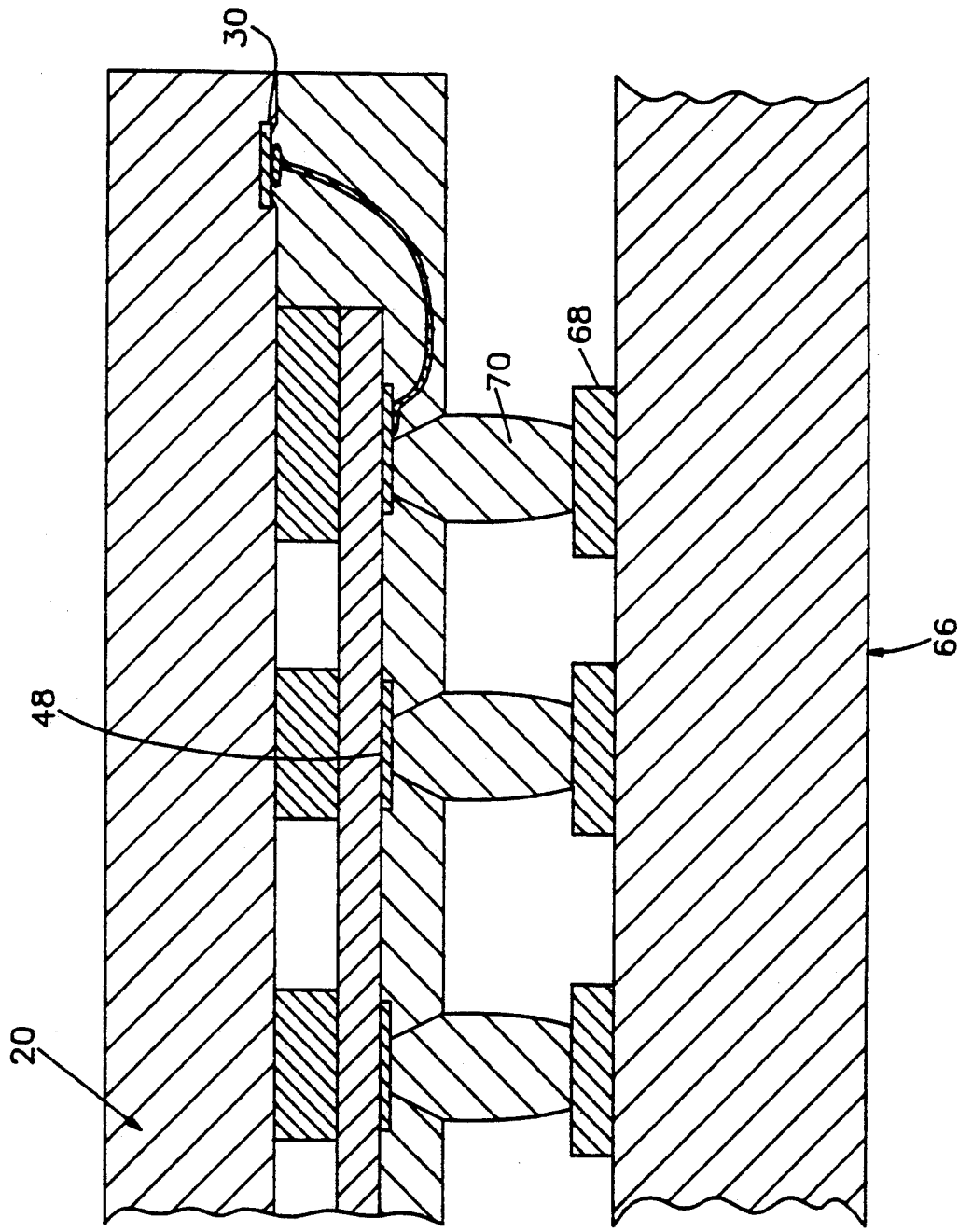
FIG. 5 is a view similar to FIG. 4, depicting the same components in conjunction with additional components.

In the next stage of the process, a low elastic modulus dielectric encapsulant such as a silicone rubber or other castable elastomer 58 (FIG. 4) is applied over the interposer and chip and over bonding wires 56. The encapsulant is applied so as to leave holes 60 in alignment with each of the central terminals 48 on the interposer. This may be accomplished by applying the encapsulant 58 in a selective coating process such as silk screening or the like; by applying the encapsulant to cover the entire assembly but then etching the encapsulant to form the holes, or by using a selective curing process. Thus, encapsulant 58 may be an encapsulant which is curable by ultraviolet or other radiant energy. Radiant energy may be supplied selectively so that the areas overlying terminals 48 remained uncured and so that the encapsulant can then be removed from these areas by a washing or etching operation. At this stage, the assembly is relatively rugged and can be handled readily. Thus, the wires 56 are fully protected by the encapsulant.

Either before or after the encapsulant 58 is applied, the chip and all of the connections made within the assembly can be tested by making temporary electrical connections to the central terminals 48. Because the central terminals 48 are at substantial center-to-center distances, they may be readily contacted with probes such as the plural probe set 62 schematically illustrated in FIG. 4. Moreover, because the bottom layer 40 of the interposer is compliant, each central terminal 48 is displaceable towards and away from the front surface 22 of the chip 20. Thus, the bottom layer can be compressed by the tips 64 of the probe set 62. This greatly facilitates making good electrical contact between a plurality of probes and a plurality of central terminals at once, and hence greatly facilitates electrical testing of the chip and the other components of the assembly. The configuration of compliant layer 40 contributes to this action. Each mass 43 of low-modulus material provides backing and support for the aligned terminal 48. As the tips 64 of the test probe set 62 engage the terminals, each mass 43 is compressed in the vertical direction and therefore tends to bulge in horizontal directions, parallel to the plane of the chip. Holes 41 provide space for such bulging. Compliant layer 40 need only provide for sufficient downward movement of terminals 48 to accommodate tolerances in the components and test equipment by accomodating differences in vertical position between adjacent terminals and/or test probes. Typically, about 0.005 inch (0.125 mm) or less compliance is sufficient. For example, complaint layer 40 may be about 0.008 inch (0.2 mm) thick.

Although test probe set 62 is schematically illustrated as including only a few tips 64, the test probe set in fact may include a full compliment of tips 64, equal in number to the number of terminals 48, so that all of terminals 48 can be engaged simultaneously. The tips of probe set 62 may be rigidly mounted to a common support 65. Therefore, the test probe set may be rugged, reliable and durable. The particular shape of tips 64 is not critical. However, tips 64 may desirably be formed as small metallic spheres solder-bonded to support 65. Support 65 in turn may be a ceramic body with appropriate internal leads, similar to a conventional semiconductor substrate. Because the test probe set may make simultaneous connections with all terminals in the subassembly, and because the test probe set may have dimensions and configuration similar to a real substrate, the temporary electrical connection made using the test probe can provide a realistic test of the chip and interposer subassembly. In particular, the test probe set need not involve long leads which may introduce unwanted inductance and/or capitance. Accordingly, the test probe set can be employed to test and operate the chip at full speed. Because the test probe set may be a simple, economical device, many such probe sets can be provided in a manufacturing plant, so that each chip can be tested for a prolonged period.

In the next stage of the assembly operation after testing, the chip and interposer subassembly is juxtaposed with a substrate 66 having electrical contact pads 68 thereon. The assembly is placed on the substrate so that the central terminals 48 face toward the electrical contact pad 68 on the substrate, and so that each central terminal 48 is aligned with one contact pad 68. Masses of an electrically conductive bonding material such as a solder or an electrically conducted adhesive may be disposed between the central terminals and the contact pads of the substrate. These masses may then be caused to flow and to bond with the central terminals 48 and the contact pads 68 thereby forming mechanical and electrical connections between the central terminals and the contact pads. This stage of the process may utilize essentially the same techniques as are employed in surface mount technology for assembly of components on printed circuit boards. Because the central terminals 48 are disposed at substantial center-to-center distances, the standard surface mount techniques can be used without difficulty. For example, a high I/O count can be achieved with 20-25 mil (500-625 micrometer) center-to-center distances. In an alternate embodiment, each contact pad 68 on the substrate may be a microminiature separable connector such as a socket, and a mating separable connector may be provided on each terminal 48. For example, each terminal 48 may incorporate a miniature pin adapted to engage such a socket. In this case, the pins would serve as the means for connecting terminals 48 to the contact pads of the substrate.

Inasmuch as each peripheral contact 30 on the chip is connected to one of the central terminals 48 on the interposer, and each such central terminal is connected to one of the contact pads 68 on the substrate, each peripheral contact 30 is connected to one of the contact pads 68 of the substrate. The substrate contact pad 68 of course may be connected to other elements of an electrical circuit through conventional connections (not shown) incorporated in substrate 66. For example, substrate 66 may be a circuit board, circuit panel or hybrid circuit substrate incorporating various electronic elements in addition to chip 20.

The interconnections between the chip and the substrate (between peripheral contacts 30 and contact pads 68) are accommodated within the area of the chip itself, i.e., within the area on the substrate occupied by chip 20. Thus, no space on the surface of the substrate is wasted by a conventional "fan-out" pattern of interconnections. Moreover, the assembly is substantially resistant to thermal cycling. Each of the composite leads connecting one of the chip peripheral contacts and one of the central terminals 48 on the interposer is flexible. Thus, the partial leads 50 (FIG. 3) on the interposer surface itself preferably are flexible, and the fine bonding wires 56 are also flexible. The interposer itself, and particularly the top layer 38 and bottom compliant layer 40 may be flexible. Accordingly, there can be substantial movement of terminals 48 on the interposer relative to contacts 30 on the chip in directions parallel to the chip front surface. Such movement can be accommodated without applying substantial forces to the junctions between the leads and the chip contacts. During use of the assembly, differential thermal expansion of chip 20 and substrate 66 may cause appreciable displacement of contact pads 68 relative to peripheral contacts 30 on the chip. Inasmuch as the central terminals 48 of the interposer are bonded to the contact pads by relatively stiff noncompliant conductive masses, the central terminals will tend to move with the contact pads. However, such movement is readily accommodated and does not result in substantial stresses at the bonds between the central terminals and contact pads.

Figure 6:
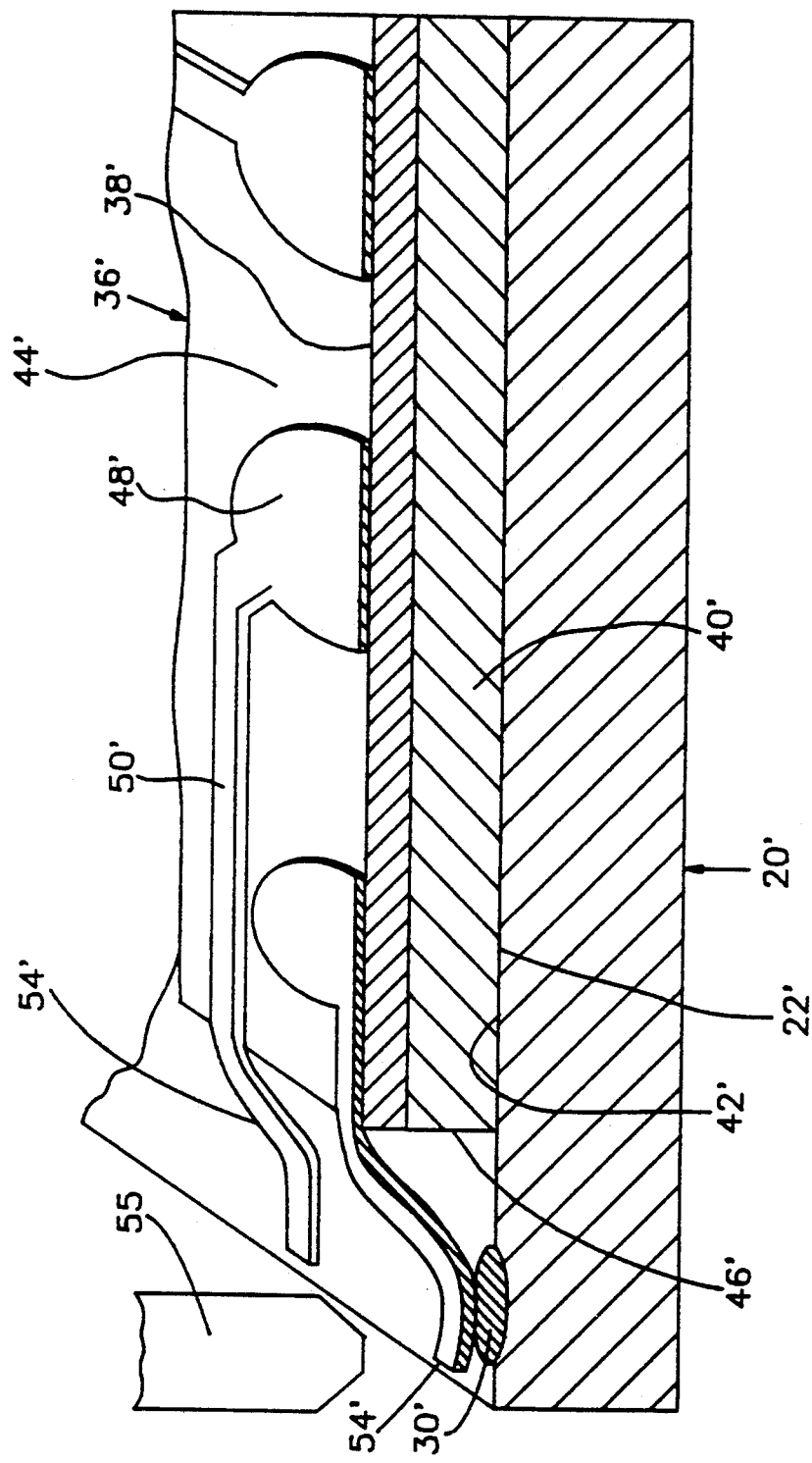
FIG. 6 is a fragmentary, diagrammatic sectional view depicting an assembly operation according to a further embodiment of the invention.

The assembly shown in FIG. 6 has an interposer 36' similar to the interposer discussed above with reference to FIGS. 1-5. However, the prefabricated leads 50' associated with terminals 48' have outer or contact portions 54' projecting outwardly beyond the edge 46' of the interposer. As prefabricated leads 50' are disposed on top layer 38' of the interposer, the prefabricated leads cross the edge 46' of the interposer at an appreciable height above the first or bottom surface 42' of the interposer. The projection, outer portions 54' are curved downwardly, toward the first surface 42' of the interposer. This curvature desirably is provided during fabrication of the interposer and leads, before the interposer is assembled to the chip. In the assembly operation, the interposer 36', with the leads 50' and terminals 48' already mounted thereon is placed onto chip 20' so that the outer portions 54' are in alignment with contacts 30' of the chip. The curvature of the leads places the outer or contact portions 54' in close proximity to chip contacts 30' A tool 55 is then applied to the outer portions 54' so as to force the outer portions thus forcing leads 54' into engagement with the chip contacts 30' so as to bond the outer portions 54 of leads 50' directly to the chip contacts. Typically, pressure is applied through tool 55 along with heat and/or ultrasonic energy. This stage of the process may employ conventional thermal compression or ultrasonic bonding techniques commonly used to bond inner leads in a tape automated bonding or "TAB" operation. This bonding establishes a connection between each chip contact 50' and one of the terminals 48' on the interposer, without the need for any intermediate wire bonding operation. Once the contacts and terminals are connected in this manner, the resulting subassembly can be encapsulated and bonded to a substrate in substantially the same fashion as discussed above. A leads 50' are flexible, terminals 48' are movable with respect to contacts 30' to compensate for thermal expansion.

The terminals 48' and leads 50' used in this structure can be fabricated by photolithigraphic techniques. For example, the interposer may initially be fabricated with a solid sheet of copper or other metal covering the second surface 44' and extending beyond edges 46'. These portions of the metal sheet extending beyond the edges of the interposer may be embossed to impact a downward curvature The surface of the metallic layer facing upwardly away from the interposer (facing toward the top of the drawing in FIG. 6) may be covered with a conventional photo resist pattern such that the photo resist covers the areas corresponding to the terminals 48' and leads 50'. The opposite surface of the sheet may be covered with a further photo resist in the areas extending beyond the edges 46' of the interposer. The sheet may then be exposed to an etching solution so as to remove those areas not covered by the photo resist on the top surface, i.e., to remove all areas of the metal sheet other than the terminals 48' and leads 50'. The photo resist may be removed, leaving interposer with the terminals and leads thereon. The curvature imported to the metal sheet by embossing provides the desired downward curvature in the outer portions 54' of the leads. Alternatively, the leads may be bent after etching, using a forming die. In yet another lead-forming method, the dielectric interposer, or one of the generally planar dielectric layers constituting the interposer may be provided with features projecting out of the plane of the layers, such as bumps or elongated ridges. The leads may be formed by depositing metal or other conductive material so that it forms leads extending over the projecting features and then removing those portions of the dielectric layer or interposer constituting the projecting features, as by selectively etching the dielectric layer, leaving behind leads which are curved out of the plane. The step of depositing the conductive material to form the leads may be performed by selectively depositing the conductive material using conventional techniques, or by depositing conductive material and selectively etching or otherwise removing conductive material before etching the dielectric layer.

Figure 7:
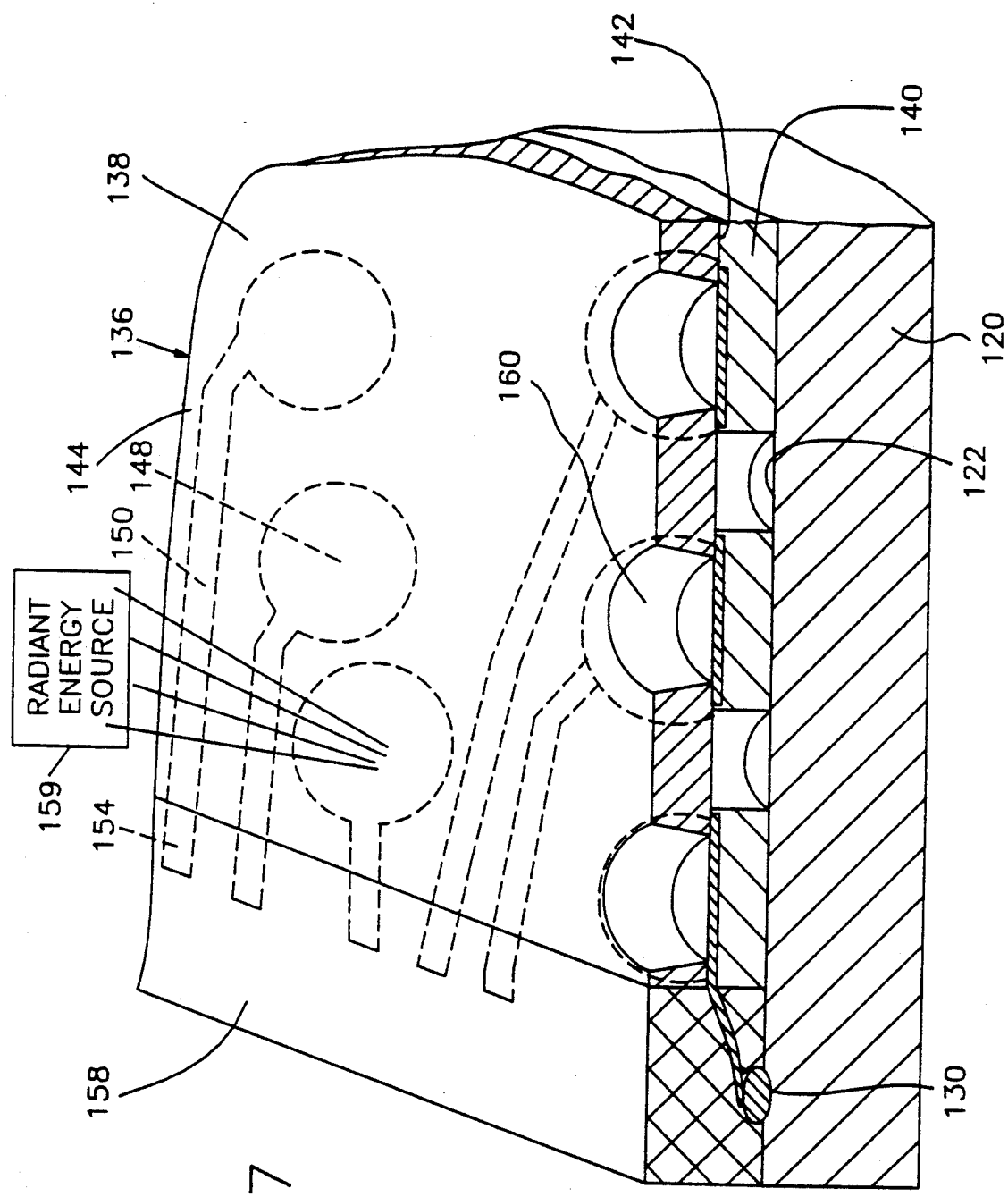
FIG. 7 is a fragmentary, diagrammatic perspective view depicting a manufacturing operation and components according to still another embodiment of the invention.

The assembly shown in FIG. 7 includes an interposer 136 incorporating a flexible top layer 138 similar to the top layer 38 of the interposer discussed above with reference to FIGS. 1-5. Terminals 148 and leads 150 with outboard portions 154 are positioned on the first or bottom surface 142 of the interposer, so that the terminals 148 face towards the chip 120 when the interposer is in position on the chip. The interposer may also include a separate compliant underlayer 140 disposed between the top layer 138 chip front surface 122, and also disposed beneath terminals 148, i.e., between the terminals and the chip. Layer 140 may be positioned on chip surface 122, before layer 138, with the leads and terminals thereon, is positioned on layer 140. Layer 140 may incorporate adhesives at its top and bottom surfaces so as to bind layer 138 to the chip. Because layer 140 is soft, layer 138 will remain flexible even when wound to the chip through layer 140, and terminals 138 will still be movable with respect to contacts 130. Alternatively, layer 140 may be formed from a partially cured elastomer such as a so-called "B-stage" silicone elastomer. After assembly of layer 138, this partially cured material may be more fully cured, as by heating it, which causes the elastomer to bond with layer 138 and with chip surface 122. The portions 154 of the leads 150 are bonded to the chip contacts 130 to connect the chip contacts 130 with terminals 148. A compliant, low elastic modulus encapsulant 158 is applied around the periphery of the interposer so as to encapsulate chip contacts 130 and the outward extensions 154 of leads 150. However, the encapsulant does not cover the first surface 144 of interposer 136. The terminals and leads are thus entirely surrounded and protected by the interposer, encapsulant and the chip itself. To provide access to the terminals 148 from the second surface of the interposer, interposer top layer 138 is punctured by applying radiant energy from a radiant energy source 159 such as a laser in registration with terminals 148 to thereby form holes 160 in alignment with the terminals. Once the holes 160 have been formed, the resulting subassembly can be bonded to a substrate in the same manner as discussed above with reference to FIG. 5. Masses of a bonding material such as solder may be positioned within holes 160 so as to contact terminals 148, and these masses may be bonded to contact pads on the substrate.

Holes 160 may be formed before the interposer is connected to the chip, and indeed may be formed before the terminals 148 are positioned on the interposer. Terminals 148 and the associated leads may be formed on the interposer top layer 138 in substantially the same way as the contacts and terminals discussed above with reference to FIG. 6. Alternatively, the terminals and leads can be provided on layer 140.

Figure 10:
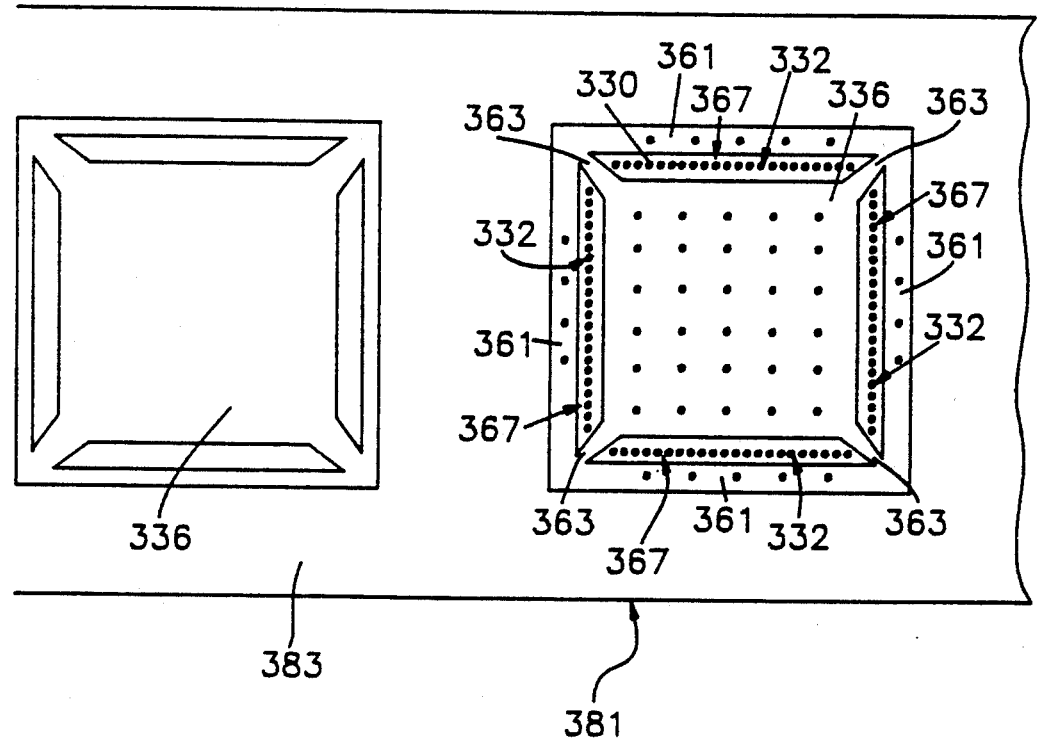
FIG. 10 is a diagrammatic plane view depicting the assembly of FIG. 9.
Figure 8:
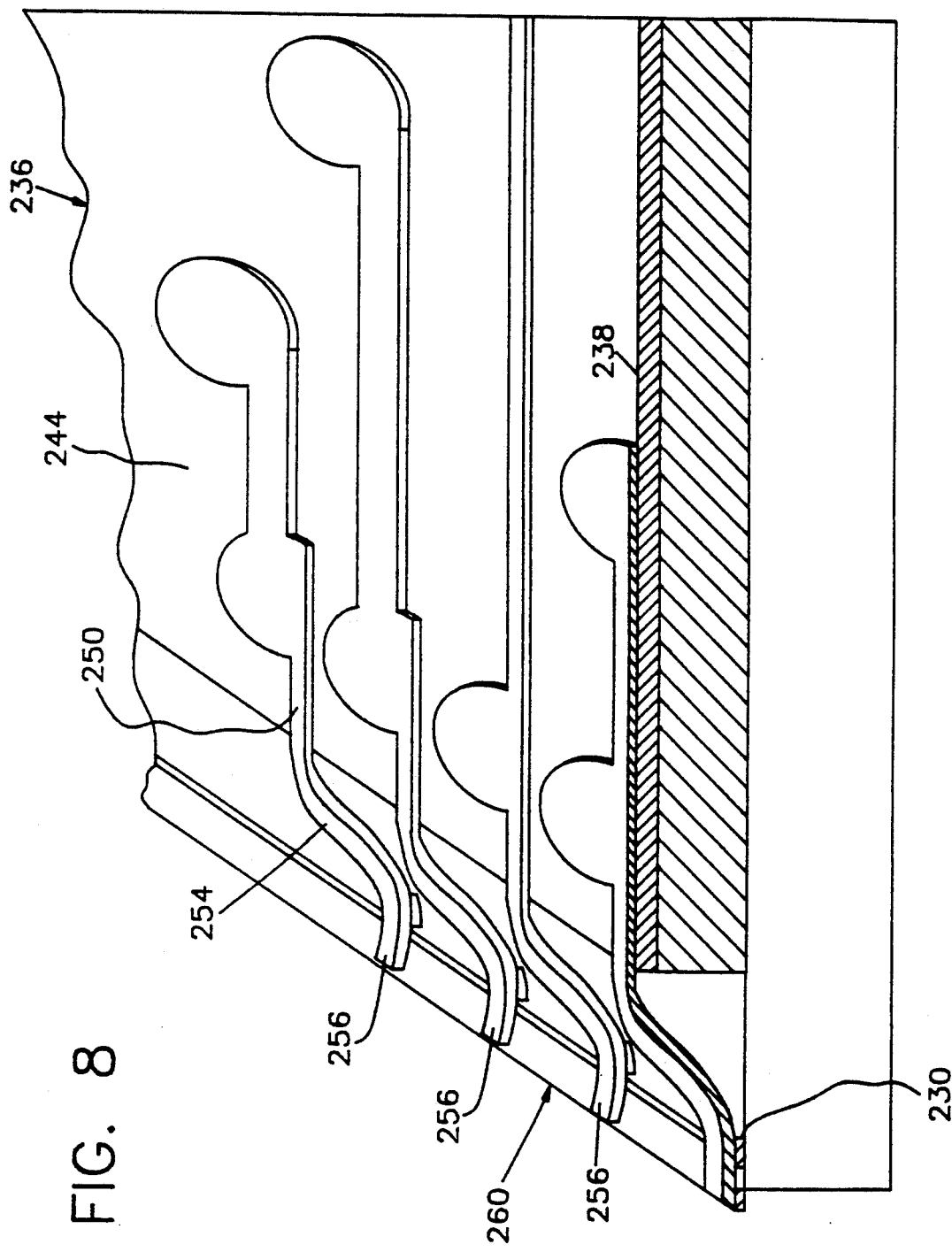
FIG. 8 is a fragmentary diagrammatic perspective view depicting an assembly according to yet another embodiment of the invention.

The assembly illustrated in FIG. 8 is similar to the assembly of FIG. 6. However, the outboard portions 254 of leads 250 have outward extensions 256 projecting outwardly beyond chip peripheral contacts 230. These outward extensions 256 are secured to a securement element 260. Preferably, securement element 260 is a bar or strip of a polymeric, electrically nonconductive material. Although only one securement element 260 is visible in FIG. 8, it should be clearly appreciated that a similar securement element 260 is provided at each edge of the interposer, so that one such securement element extends generally parallel to each row of peripheral contacts 230, each said securement element lying outboard of the chip peripheral contacts. The securement element serves to reinforce and support the outboard portions 254 of leads 250, and to prevent bending of the leads in undesired directions parallel to the surfaces of the interposer and chip. Securement element 260 may be formed as part of a common sheet with the top layer 238 of interposer 236. The assembly shown in FIGS. 9, 10 and 15 includes an interposer 336 and securement elements 361 similar to the interposer and securement elements discussed above with reference to FIG. 8. However, the central terminals 348 and peripheral contact leads 350 associated with interposer 336 are disposed on the first or chip-facing surface 342 of the interposer top layer 338. As best seen in FIG. 10, the securement elements 361 are connected to interposer 336 by bridge elements 363. The bridge elements are disposed at spaced-apart locations around the periphery of the interposer. Preferably, the interposer, securement elements and bridge elements are formed as an integral unit. All of these components may be portions of a unitary sheet of dielectric material. Thus, the interposer 336, bridge elements 363 and securement elements 361 may all be formed as part of an elongated tape 381,(FIG. 10) which may include several interposers 336, each with its associated securement elements and bridge elements. The tape may also include waste or trim areas 383. During the various assembly and handling operations, the interposers and chips may be advanced through the process by advancing the tape.

Bridge elements 363 are disposed at the corners of the interposer. The chip 320 used in this assembly includes four rows 332 of peripheral contacts 330, the rows forming a generally rectangular pattern. However, the rows of peripheral contacts stop short of the corners of this rectangular pattern, so that the corner regions of the pattern are substantially devoid of contacts 330. Bridge elements 363 overlie these corner regions, and hence do not cover any of the contacts 330.

Figure 9:
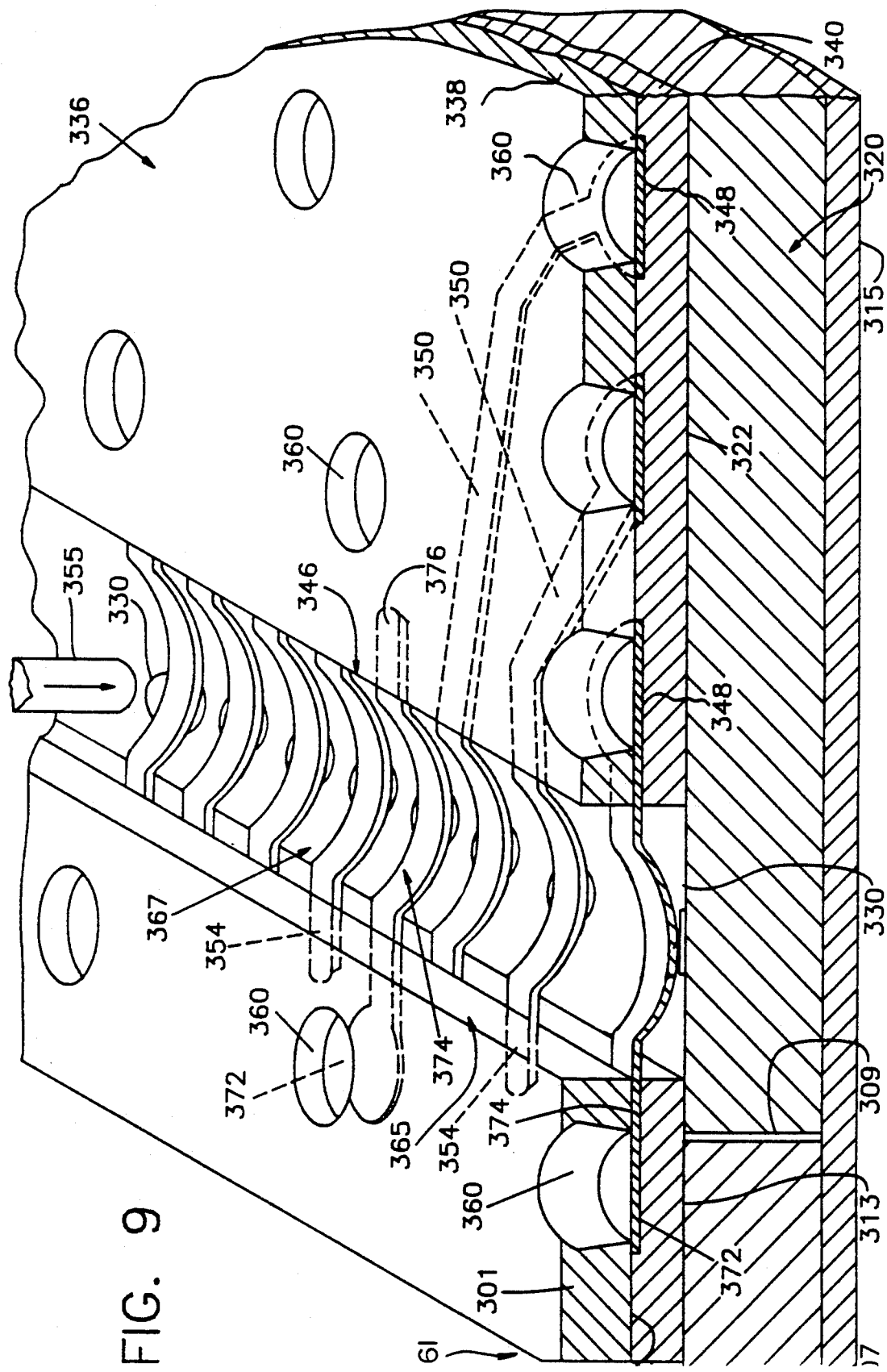
FIG. 9 is a fragmentary, partially sectional diagrammatic perspective view depicting an assembly according to a further embodiment of the invention.

Each securement element 361 includes a top layer 301 (FIG. 9). Each securement element has an inboard edge 365 extending generally parallel to an edge 346 of interposer so that these parallel edges define an elongated slot 367 between the securement element and the interposer. Slots 367 are aligned with the rows 332 of chip peripheral contacts 330. The peripheral contact leads 350 extend across slots 367, the outward extensions 354 of these leads being attached to the securement elements 361, so that each peripheral contact lead 350 is supported both by the interposer and by the securement element.

Each securement element 361 has a single row of outside terminals 372 extending generally parallel to the adjacent slot 367. Outside terminals 372 are disposed on the first or chip-facing surface 369 of the top layers 301 securement element 361. Outside terminal leads 374 (FIG. 9) extend inwardly from outside terminals 372 across slots 367. Each such outside terminal lead has an inboard end 376 secured to the interposer 336. Thus, the outside terminal leads 372 and peripheral contact leads 350 extend across slot 367. These leads are interspersed with one another along the length of each slot 367.

Holes 360 are provided in the interposer and in each securement element top layer in alignment with the central terminals 348 and Outside terminals 372 so that the central terminals and outside terminals are accessible from the second surfaces of the interposer and securement elements, i.e., from the surface facing away from the chip.

Interposer 336 includes a compliant bottom layer 340, and each securement element 361 may include a compliant bottom layer 303 (FIG. 9). All of these compliant layers may be similar to the compliant layers discussed above, and may include holes (not shown) to increase their compliance. The compliant layers of the interposer and securement elements may be formed and assembled separately from these components, or may be incorporated in tape 381.

Figure 15:
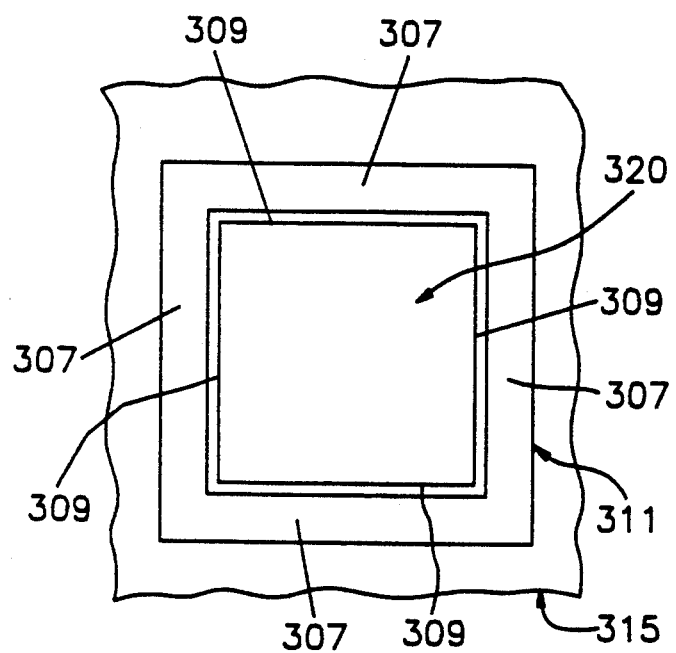
FIG. 15 is a fragmentary plan view depicting certain components used in the assembly according to FIGS. 9 and 10.

The leads and terminals may be formed in place on the interposer and on the securement elements by an etchinq process similar to those described above. A copper or other metallic sheet may be laminated to the dielectric sheet which will ultimately form the interposer top layer 338 and the securement element top layers 301, and then covered with a photoresist pattern and etched to form the various terminals and leads. Holes 360 and slots 367 may be formed after the terminals and leads, by selectively applying radiant energy such as laser radiation to the sheet to selectively remove portions of the sheet. Alternatively, the slots and holes may be formed before the leads and terminals, as by etching or mechanically punching the dielectric sheet. The leads and terminals may then be formed by applying and selectively etching a metallic layer. In this case, the holes and slots in the dielectric sheet should be temporarily filled with a resist to prevent unwanted etching of the leads and terminals by etchant entering through the holes and slots. Peripheral contact leads 350 and outside terminal leads 374 are bent downwardly, toward the bottom of the interposer, within slots 367. The downward curvature of these leads may be formed by embossing the sheet used to fabricate these leads. Thus, although each lead 350 and 374 extends into a slot 367 from above the bottom layers 303 and 340 of the securement elements and interposer, each such lead extends to the bottom of the interposer. Before the interposer is assembled to the chip, a set of support elements 307 is juxtaposed with chip 320 so that one such support element lies alongside each edge 309 of the chip. As best seen in FIG. 15, support elements 307 may be provided as a unitary rectangular ring 311 which may closely surround the edges of the chip. Each support element has a top surface 313 arranged to lie substantially coplanar with the front or top surface 322 of the chip. Thus, chip 320 and support elements 307 may be disposed on a planar carrier 315, and the thickness of the support elements may be substantially equal to the thickness of the chip.

In assembling the interposer to the chip, the interposer with the various terminals and leads thereon is positioned on the chip so that the slots, and hence the leads, are aligned with the peripheral contacts on the chip. Each securement element 361 overlies one support element 307, and is at least partially supported by such element. A bonding tool is then advanced into each slot 367 and engaged with the peripheral contact leads 350 and with the outside terminal leads 372, so as to force each such lead into engagement with one of the peripheral contacts 330 on the chip. Heat, pressure and ultrasonic energy may be applied through the tool to promote bonding. The arrangement of the leads within the slots greatly facilitates the bonding operation. Bonding tool 355 may be advanced into one of the slots 367 and moved along the length of the slot so as to bond all of the leads to all of the peripheral contacts 330 aligned with that slot. This process may be repeated for each slot 367. The tool may engage and bond many leads simultaneously.

After the leads have been bonded to the contacts, a low modulus dielectric encapsulant (not shown) is applied. In an alternative assembly process, the compliant layers 340 and 303 may be formed by the encapsulant. Thus, the encapsulant may be applied so as to penetrate between the interposer (not shown) and the chip to form compliant layer 340 between the interposer and the chip. The encapsulant may also penetrate between securement elements 361 and support elements 307 to form compliant layers 303 in slots 367 to cover leads 374 and 350. The encapsulant may be introduced under pressure in a liquid or flowable state and then cured. The interposer, chip and associated elements may be disposed in a mold during this process, and the mold may clamp the waste areas 383 of the sheet or tape (FIG. 10) so as to limit the flow of the encapsulant. The encapsulant may be injected under pressure using standard injection molding technique. After encapsulation, the assembly illustrated in FIGS. 9 and 10 may be separated from the tape and mounted to a substrate in substantially the same way as the assemblies discussed above. Thus, both the outside terminals 372 and the central terminals 348 may be bonded to contact pads on the substrate.

The assembly illustrated in FIGS. 9 and 10 provides good reinforcement of the leads during manufacture. Also, the outside terminals provide increased connection capacity. Although the securement elements and outside terminals extend outwardly beyond the peripheral contacts on the chip, this outward extension or "fan-out" is minimal. Preferably, the assembly with securement elements and outside terminals occupies an area in the plane parallel to the chip surface no more than about 1.5 times, and desirably no more than about 1.2 times, the area occupied by the chip itself.

Figure 11:
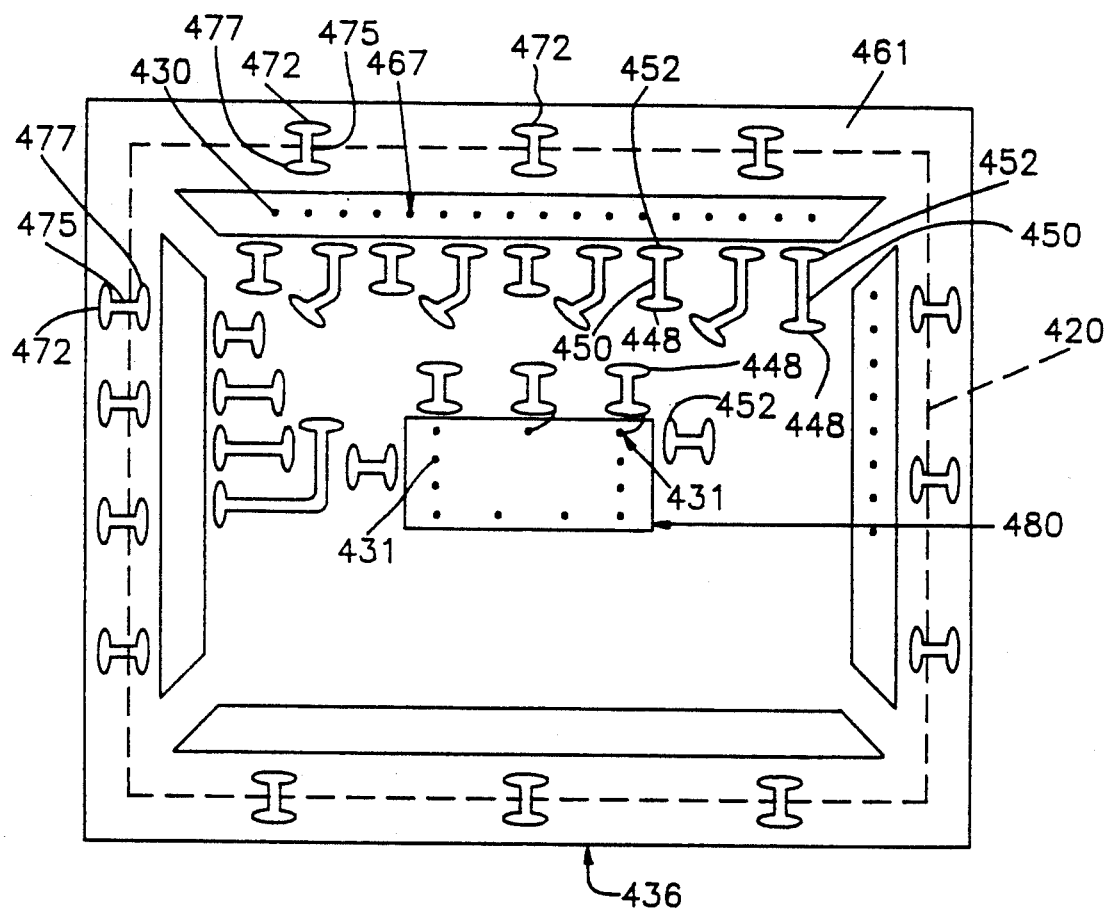
FIG. 11 is a diagrammatic plane view depicting an assembly according to yet another embodiment of the invention.

As shown in FIG. 11, an interposer 436 according to a further embodiment of the invention is provided with securement elements 461, slots 467 and outside terminals 472 similar to the corresponding components discussed above with reference to FIGS. 9 and 10. Outside terminals 472 are disposed on the second surface of each securement element, i.e., on the surface directed away from the semiconductor chip 420. Interposer 436 also has central terminals 448 on the second surface of the interposer. Each central terminal 448 is connected to a partial lead 450 and bonding terminal 452. Likewise, each outside terminal 472 is connected to a similar partial lead 475 and bonding terminal 477. There are rows of bonding terminals 452 and 477 on both sides of each slot 467. The bonding terminals are connected to the peripheral contacts 430 on chip 420 by a wire-bonding operation similar to that discussed above with reference to FIGS. 1-5. Here again, disposition of the bonding terminals in rows facilitates the wire-bonding operation.

Chip 420 also has central contacts 431 disposed in the central region of the chip front surface. Interposer 436 has a hole 480 encompassing these central contacts. Some of the bonding terminals 452 associated with certain central terminals 448 are disposed adjacent the edges of hole 480. These bonding terminals are connected by wire bonds to the central contacts 431 of the chip, so that the central contacts as well as the peripheral contacts 430 will be connected to the substrate through the central terminals 448 of the interposer.

Figure 12:
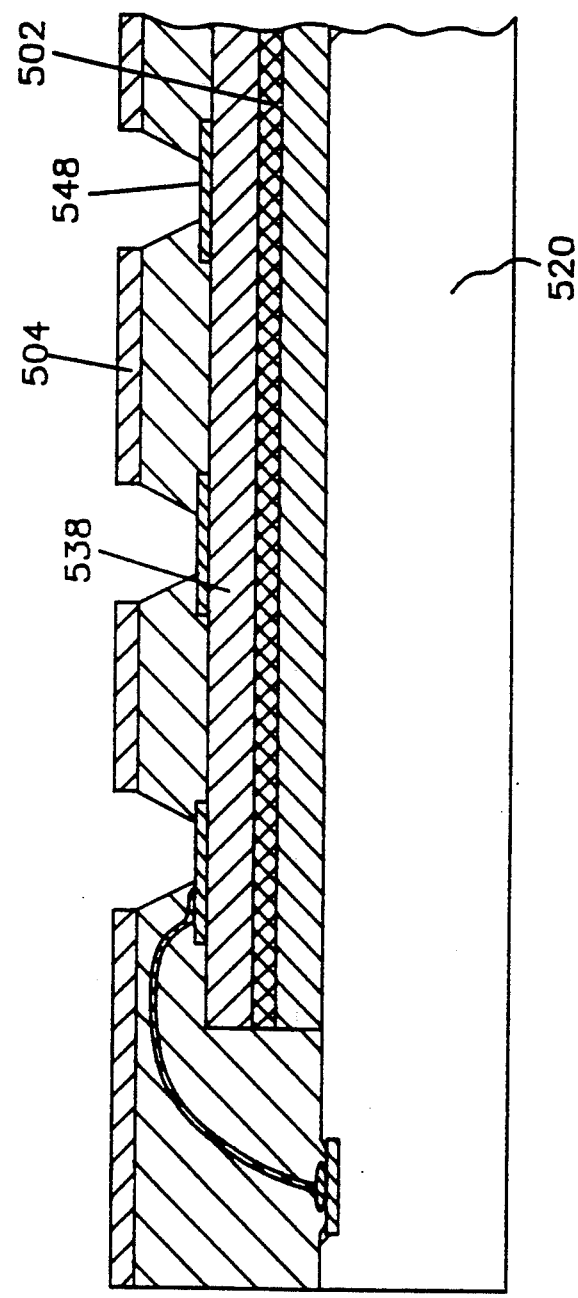
FIG. 12 is a fragmentary diagrammatic sectional view similar to FIG. 4 but depicting an assembly according to a further embodiment of the invention.
Figure 13:
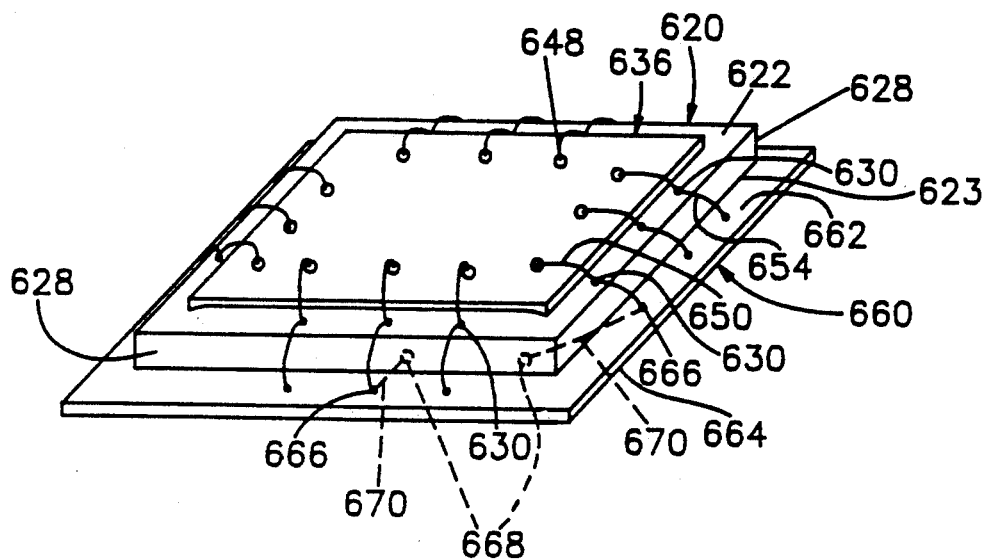
FIG. 13 is a diagrammatic perspective view depicting an assembly according to yet another embodiment of the invention.

As illustrated in FIG. 12, assemblies according to the invention may include additional elements for mechanical and electrical protection. Thus, a thin electrically conductive layer such as a metallic layer 502 may be incorporated in the interposer to electrically isolate the central terminals 548 from the chip 520. Such a conductive layer must be separated from terminals 548 by a dielectric layer 538. Additionally, a rigid cover layer 504 may be provided to further protect the assembly during manufacturing operations. The interposer itself may include multiple layers of central terminals and leads separated from one another by intermediate dielectric layers. Such an arrangement allows the leads on the interposer to cross over one another without contacting one another, and allows for more leads and/or wider leads in a given area. The topmost layers of such a multilayer interposer may have holes aligned with the central terminals of the lower layers, to provide access to these lower-layer terminals and permit connection to a substrate.

A semiconductor chip assembly according to yet another embodiment of the present invention includes a chip 620 having a generally planar front surface 622, a generally planar rear surface 623 extending substantially parallel to front surface 622 and edges 628 extending between these surfaces. The chip has peripheral contacts 630 arranged in rows adjacent the edges of the chip. An interposer 636 overlies the central region of the chip front surface. Interposer 636 has central terminals 648. These terminals are connected to the peripheral contacts 630 of the chip by leads 650. Leads 650 have outer extensions 654 extending outwardly beyond the peripheral contacts 630 and beyond the edges 628 of the chip.

A sheetlike backing element 660 abuts the rear face 623 of chip 620, so that the chip is sandwiched between backing element 660 and interposer 636. Backing element 660 has a top surface 662 facing the chip and a bottom surface 664 facing away from the chip. The backing element extends outwardly beyond the edges 628 of the chip.

Backing element 654 has outside terminals 666 disposed outboard of the chip edges 628 on backing element top surface 662. The outward extensions 654 of the leads from interposer 636 are connected to outside terminals 666, and hence the outward extensions are secured to the backing element. Outside terminals 666 are electrically connected to inside terminals 668 disposed on the bottom surface 664 of the backing element. Inside terminals 668 are disposed in the central region of the backing element, in alignment with the chip 620 and interposer 636. The pattern of inside terminals 668 on the backing element desirably corresponds to the pattern of central terminals 648 on the interposer 636.

Figure 14:
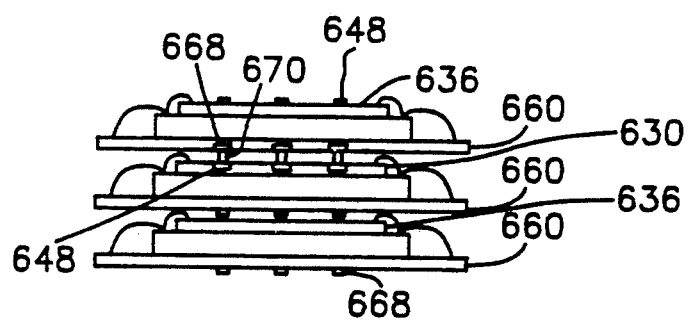
FIG. 14 is a diagrammatic elevational view depicting an assembly in accordance with a further embodiment.

A plurality of these chip assemblies can be combined to form a larger, multi-chip circuit assembly. As shown in FIG. 14, the chip assemblies are stacked one atop the other, with the backing element 660 of each chip assembly overlying the interposer 636 of the next lower chip assembly. The inside terminals 648 on the backing element of each chip assembly are aligned with the central terminals 648 on the interposer of the immediately subjacent (next lower) chip assembly. These aligned terminals are mechanically and electrically connected to one another, as by masses of electrically conductive bonding material 670 such as solder or electrically conductive adhesives. Thus, the leads and contacts of the various chip assemblies are electrically connected to one another, thereby connecting the chips to one another. The circuit assembly according to this aspect of the invention may be connected to a larger substrate by bonding the central terminals 648 on the interposer of the topmost chip assembly to a substrate, or by bonding the inside terminals 668 on the bottom chip assembly to a substrate, or both.

Circuit assemblies according to this aspect of the present invention are particularly useful for accommodating large numbers of chips in a small area. These assemblies are especially useful with memory chips such as random access memory chips. Using this aspect of the invention, plural memory chips can be provided with parallel connections to a data bus and stacked in essentially the same circuit board area as ordinarily occupied by a single chip.

Figure 16:
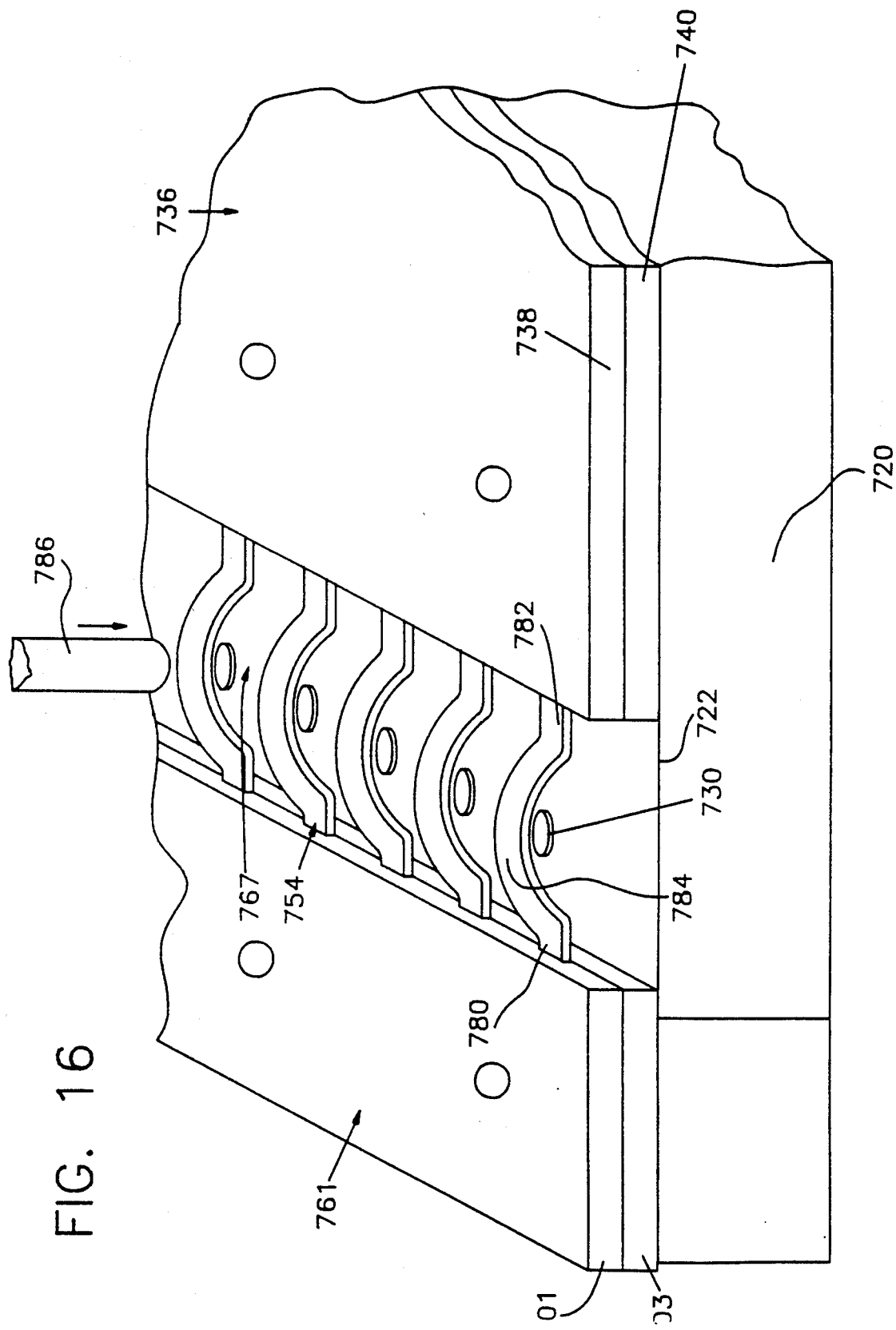
FIG. 16 is a fragmentary perspective view similar to FIG. 10 but depicting portions of any assembly in accordance with a further embodiment of the invention

The components illustrated in FIG. 16 are similar to those depicted in FIGS. 9 and 10. Thus, the structure includes an interposer 736 and securement elements 761 defining slots 767 therebetween, only one such securement element and slot being visible in FIG. 16. The outside terminal leads and peripheral leads include portions 754 extending across the slots. Each such lead portion extends into the slot from above the compliant layer 703 of the associated securement element and above the compliant layer 740 of the interposer. In the condition illustrated in FIG. 16, before bonding of lead portions 754 to terminals 730 of the chip, these lead portions are substantially planar. That is, they extend substantially in a plane parallel to the plane of interposer 736 and hence parallel to the plane of chip front surface 722 when the interposer overlies the chip. Each such lead is curved in this horizontal plane, in the direction of elongation of the slot. Thus, each such lead includes end portion 780 and 782 at the edges of the slot, adjacent securement element 761 and interposer 736 respectively. Each lead portion 754 further includes a middle portion 784 adjacent the center of the slot and overlying one of the peripheral contacts 730 on chip 720. Each such middle portion 784 is offset from the imaginary axis connecting ends 780 and 782. As shown in FIG. 16, the offset is in the direction of elongation of slot 767. During the assembly process, a tool 786 is advanced into slot 767 to bond lead portion 754 to chip peripheral contact 730. The tool engages the middle portion 784 of each lead portion, and forces the middle portion downwardly into engagement with chip contact 730. Because the middle portion is offset from the axis connecting ends 780 and 782, this downward motion of the middle portion can be accommodated by a controlled twisting motion of the ends. The middle portion 784 may also bend downwardly to some degree. This structure provides a controlled downward motion of middle portion 784. As each lead portion 754 is retained at ends 780 and 782 during this operation, the portions will remain in the desired positions and hence will be properly aligned with chip contact 730. As all of the middle portions 784 are offset in the same direction, the offsets in the lead portions do not appreciably increase the required spacings between lead portions 754 along the length of slot 767. Moreover, these offsets, lying in the plane of the interposer, can be formed without any separate embossing or bending operation, in the same etching operation used to form the leads. The bonding tool may engage and bond the middle portions of several leads simultaneously.

As will be readily appreciated, numerous variations and combinations of the features discussed above can be utilized. For example, the bridge elements 363 (FIG. 10) connecting an interposer with the associated securement elements need not be disposed at the corners of a chip. Also, the interposer need not overlie the entire front or top surface of the chip but may instead overlie only a portion of the chip front surface. As these and numerous other variations and combinations of the features discussed above may be employed with departing from the present invention, the foregoing description of the preferred embodiment should be taken by way of illustration, rather than by way of limitation, of the features discussed above.

What is claimed is:

1. A method of making a semiconductor chip assembly comprising the step of:
    (a) providing a semiconductor chip having a front surface defining the top of the chip, said front surface including a central region and a peripheral region surrounding said central region, whereby said central region is disposed inwardly of said peripheral region, said chip having a plurality of peripheral contacts disposed in said peripheral region of said front surface;
    (b) assembling a sheetlike dielectric interposer formed separately from said chip to said chip so that said interposer overlies said central region of said chip front surface with the outboard edges of said interposer disposed inwardly of said peripheral contacts on said chip so that a first surface of said interposer faces downwardly toward said chip a second surface of said interposer faces upwardly away from said chip and a plurality of central terminals disposed ons aid interposer and adapted for connection to contact pads of a substrate overlie said central region of said chip from surface; and
    c) connecting a plurality of peripheral contact leads between at least some of said peripheral contacts and said central terminals on said interposer so that each said peripheral contact lead extends inwardly from one of said peripheral contacts to one of said central terminals on said interposer and so that said central terminals are movable with respect to said chip so as to compensate for thermal expansion of said chip.

2. A method as claimed in claim 1 further comprising the step of assembling a substrate having a plurality of contact pads to said assembled interposer and chip and connecting each of said central terminals on said interposer to one of said contact pads on said substrate.

3. A method as claimed in claim 1 further comprising the step of providing prefabricated leads mounted on said interposer and connected to said central terminals before said interposer is assembled to said chip, whereby said prefabricated leads are positioned on said chip when said interposer is assembled to said chip, said step of connecting said peripheral contact leads including the step of connecting said prefabricated leads to said contacts.

4. A method as claimed in claim 3 wherein said interposer includes a top layer defining said second surface, said step of assembling the interposer to the chip including the step of placing said interposer so that said top layer is disposed above said central terminals, the method further comprising the step of forming apertures in said top layer in alignment with said terminals by directing radiant energy onto said interposer in alignment with said terminals after said interposer is assembled to said chip.

5. A method as claimed in claim 3 wherein each said prefabricated lead includes a contact section projecting outwardly beyond an outboard edge of the interposer, said step of assembling said interposer to said chip including the step of aligning the contact sections of said prefabricated leads with said peripheral contacts on said chip, said step of connecting peripheral contact leads including the step of bonding said contact sections of said prefabricated leads to said peripheral contacts on said chip.

6. A method as claimed in claim 5 wherein said interposer includes a compliant layer, said step of assembling said interposer to said chip including the step of placing said interposer so that said compliant layer is disposed beneath said prefabricated leads, whereby said prefabricated leads will project outwardly from above said compliant layer after said assembling step, the method further comprising the step of forming bends in the contact sections of said prefabricated leads prior to said bonding step.

7. A method as claimed in claim 6 wherein said step of forming bends is performed so that said contact sections of said prefabricated leads are bent downwardly toward said compliant layer, whereby said contact sections will curve downwardly toward said chip in the vicinity of said contacts when said interposer is assembled to said chip 8. A method as claimed in claim 7 wherein said step of providing said prefabricated leads includes the steps of providing a dielectric layer of said interposer with features which project vertically out of the plane of said interposer, depositing conductive material on said dielectric layer so that said conductive material forms leads extending across said projecting features, and then selectively removing the portions of said dielectric layer constituting said projecting features, whereby said bends in said prefabricated leads are formed during said depositing step.

9. A method as claimed in claim 6 wherein said step of forming said bends is performed so that said contact sections of said peripheral contact leads are bent in directions generally parallel to the plane of said sheet-like interposer.

10. A method as claimed in claim 6 wherein said step of forming said bends is performed before said step of assembling said interposer to said chip.

11. A method as claimed in claim 6 wherein said peripheral contact leads have outboard extensions extending outwardly beyond their respective contact sections and wherein said outboard extensions are secured to a plurality of securement elements disposed outboard of said interposer, said securement elements physically supporting said extensions during said assembling and bonding steps.

12. A method as claimed in claim 5 wherein said securement elements and said interposer define slots extending along the edges of said interposer, said contact sections of said prefabricated leads extending across said slots, said bonding step including the step of advancing a bonding tool into said slots.

13. A method as claimed in claim 3 wherein said prefabricated leads terminate at outboard ends adjacent the outboard edges of said interposer, whereby said outboard ends of said prefabricated leads are positioned inboard of said peripheral contacts on said chip when said interposer is assembled to said chip, said step of connecting peripheral contact leads including the step of wire bonding the outboard end of each said prefabricated lead to one of said peripheral contacts on said chip so that bonding wires extend across the outboard edge of said interposer and form parts of said peripheral contact leads.

14. A method as claimed in claim 1 further comprising the step of testing the chip by establishing temporary electrical contact between a plurality of test probes and said central terminals after said step of connecting said peripheral contact leads and utilizing said temporary electrical contact to actuate said chip.

15. A method as claimed in claim 14 wherein said interposer includes a compliant layer, said step of assembling said interposer to said chip including the step of placing said compliant layer beneath said central terminals so that said compliant layer is interposed between said central terminals and said chip, said step of establishing temporary electrical contact including the step of simultaneously establishing temporary contact between a plurality of said central contacts and a plurality of test probes rigidly connected to a test fixture, whereby said compliant layer will permit displacement of at least some of said central terminals toward said chip during said step of establishing temporary electrical contact.

16. A method as claimed in claim 13 wherein said peripheral contacts on said chip are disposed in rows, and wherein said outboard ends of said prefabricated leads are provided in rows adjacent to the outboard edges of said interposer, one said row of outboard ends of the prefabricated leads being positioned parallel to and adjacent to each row of peripheral contacts on the chip when said interposer is assembled to said chip.

* * * * *